United States Patent
Chen (10) Patent No.: US 10,340,307 B1
(45) Date of Patent: Jul. 2, 2019

(54) LIGHT EMITTING DIODE HAVING CURRENT CONFINEMENT STRUCTURE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/849,628

(22) Filed: Dec. 20, 2017

(51) Int. Cl.
| | |
|---|---|
| *H01L 21/00* | (2006.01) |
| *H01L 27/15* | (2006.01) |
| *H01L 51/52* | (2006.01) |
| *H01L 23/538* | (2006.01) |
| *H01L 33/00* | (2010.01) |
| *H01L 33/26* | (2010.01) |
| *H01L 33/40* | (2010.01) |

(52) U.S. Cl.
CPC ............ *H01L 27/15* (2013.01); *H01L 23/538* (2013.01); *H01L 33/0008* (2013.01); *H01L 33/26* (2013.01); *H01L 33/40* (2013.01); *H01L 51/5203* (2013.01)

(58) Field of Classification Search
None
See application file for complete search history.

(56) References Cited

U.S. PATENT DOCUMENTS

2016/0072012 A1\* 3/2016 Chen ................ H01L 33/145
257/101

\* cited by examiner

*Primary Examiner* — Long Pham
(74) *Attorney, Agent, or Firm* — CKC & Partners Co., LLC (57) ABSTRACT

A light-emitting diode includes semiconductor layers and electrodes. A first type semiconductor layer includes first and second low resistance portions and a high resistance portion therebetween. The high resistance portion encloses the first low resistance portion and is configured to confine charge carriers substantially within the first low resistance portion. A resistivity of the first type semiconductor layer increases from the first low resistance portion toward the high resistance portion and decreases from the high resistance portion toward the second low resistance portion. A first electrode is electrically connected to the first low resistance portion and substantially no current flows between the first electrode and the second low resistance portion. A portion of the first type semiconductor layer is between the first electrode and a second type semiconductor layer. A second electrode is electrically connected to the second type semiconductor layer.

17 Claims, 13 Drawing Sheets

LIGHT EMITTING DIODE HAVING CURRENT CONFINEMENT STRUCTURE

BACKGROUND

Field of Invention

The present disclosure relates to a light emitting diode, and more particularly, to a light emitting diode having a current confinement structure.

Description of Related Art

In the recent years, light-emitting diodes (LEDs) have become popular in general and commercial lighting applications. As light sources, LEDs have many advantages including low energy consumption, long lifetime, small size, and fast switching, and hence conventional lighting, such as incandescent lighting, is gradually replaced by LED lights.

SUMMARY

According to some embodiments of the present disclosure, a light-emitting diode (LED) including a first type semiconductor layer, a first electrode, a second type semiconductor layer, and a second electrode is provided. The first type semiconductor layer includes a first low resistance portion, at least one second low resistance portion, and a high resistance portion. The high resistance portion is between the first low resistance portion and the second low resistance portion. The first low resistance portion is enclosed by the high resistance portion. A resistivity of the first type semiconductor layer increases from the first low resistance portion toward the high resistance portion and decreases from the high resistance portion toward the second low resistance portion. The first electrode is electrically connected to the first low resistance portion and there is substantially no current flowing between the first electrode and the second low resistance portion. The high resistance portion is configured to confine charge carriers substantially within the first low resistance portion. At least a portion of the first type semiconductor layer is between the first electrode and the second type semiconductor layer. The second electrode is electrically connected to the second type semiconductor layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1:
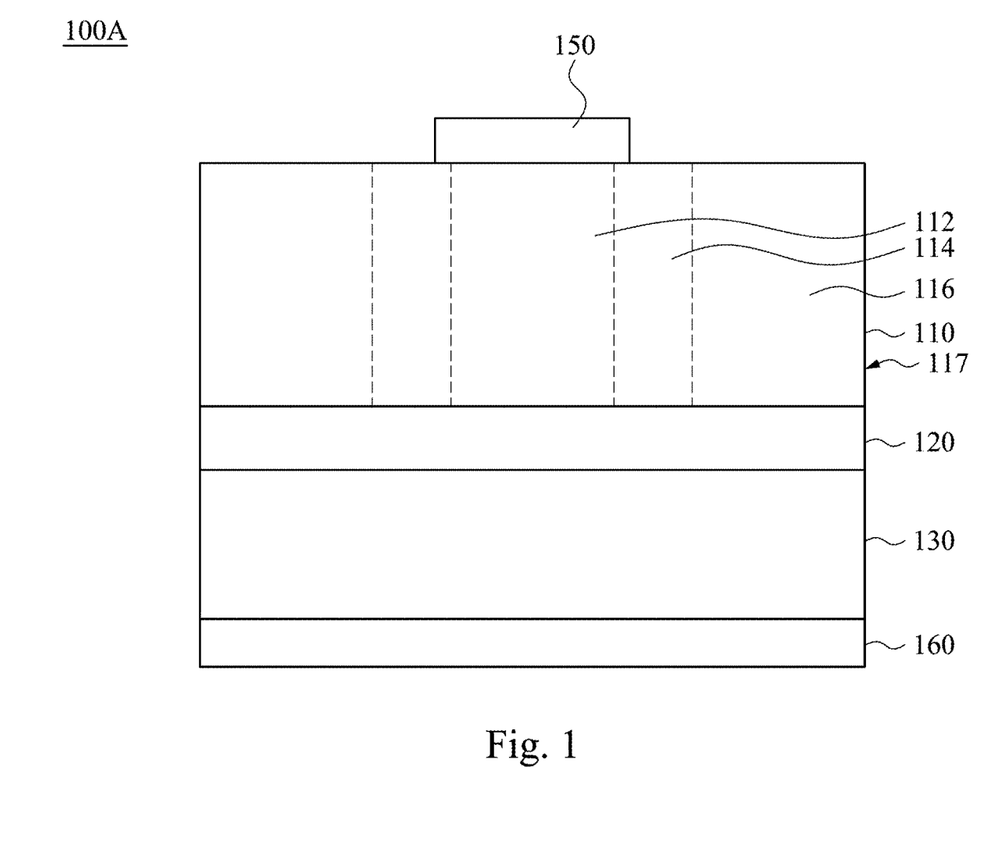
FIG. 1 is a schematic cross-sectional view of a light emitting diode according to some embodiments of the present disclosure.
Figure 2:
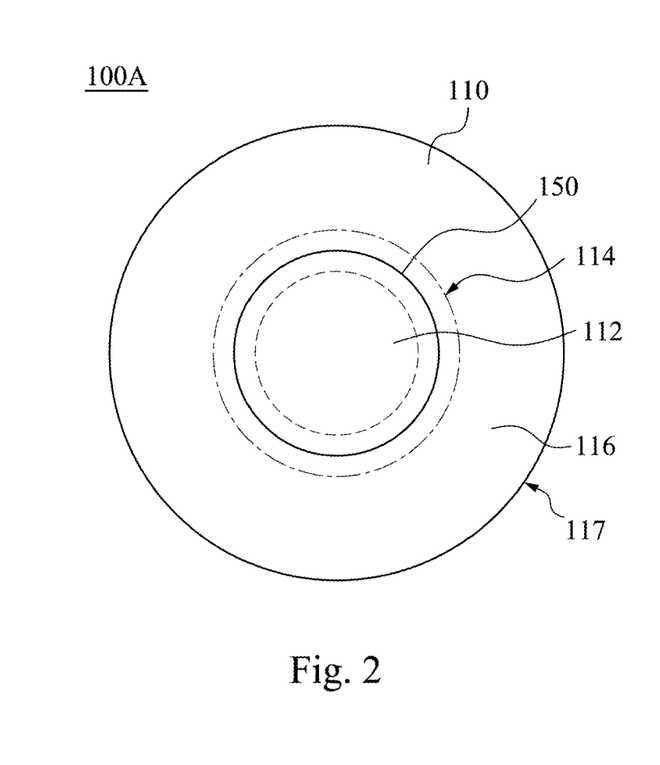
FIG. 2 is a schematic top view of a light emitting diode according to some embodiments of the present disclosure.

Reference is made to FIGS. 1 and 2. FIG. 1 is a schematic cross-sectional view of a light emitting diode 100A according to some embodiments of the present disclosure. FIG. 2 is a schematic top view of the light emitting diode 100A of FIG. 1. According to some embodiments of the present disclosure, a light-emitting diode 100A including a first type semiconductor layer 110, a first electrode 150, a second type semiconductor layer 130 and a second electrode 160 is provided. The first type semiconductor layer 110 includes a first low resistance portion 112, at least one second low resistance portion 116, and a high resistance portion 114. In some embodiments, the high resistance portion 114 is between the first low resistance portion 112 and the second low resistance portion 116, and the high resistance portion 114 defines a shape of the first low resistance portion 112. The first low resistance portion 112 is enclosed by the high resistance portion 114, and a resistivity of the first type semiconductor layer 110 increases from the first low resistance portion 112 toward the high resistance portion 114 and decreases from the high resistance portion 114 toward the second low resistance portion 116.

In some embodiments, the first electrode 150 is electrically connected to the first low resistance portion 112. There is substantially no current flowing between the first electrode 150 and the second low resistance portion 116. The "substantially no current" means the current is less than a junction leakage current of the LED under consideration. Specifically, the first electrode 150 is in contact with at least a portion of the first low resistance portion 112 and at least a portion of the high resistance portion 114 and is free from contacting with the second low resistance portion 116.

In some embodiments, at least a portion of the first type semiconductor layer 110 is between the first electrode 150 and the second type semiconductor layer 130. The second electrode 160 is electrically connected to the second type semiconductor layer 130.

In some embodiments, the first type semiconductor layer 110 is made of a p-type doped semiconductor material, and the second type semiconductor layer 130 is made of an n-type semiconductor material. In some embodiments, the first type semiconductor layer 110 is made of a p-doped compound such as AlGaN, InGaN, GaN, AlInP, AlInGaP, AlGaAs, GaAs, GaP:Zn—O, or the like.

In the embodiments mentioned above, the high resistance portion 114 is configured to confine charge carriers substantially within the first low resistance portion 112. Specifically, since the resistivity of the first type semiconductor layer 110 laterally increases from the first low resistance portion 112 toward the high resistance portion 114, when the light emitting diode 100A is biased, charge carriers are apt to flow through the first type semiconductor layer 110 via the first low resistance portion 112.

In some embodiments, light emitting diode 100A further includes an active layer 120 between the first type semiconductor layer 110 and the second type semiconductor layer 130.

Figure 3:
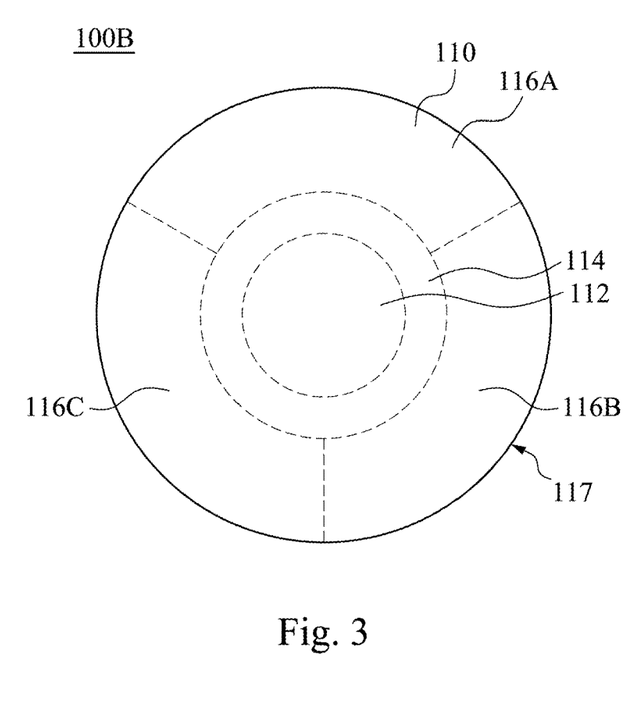
FIG. 3 is a schematic top view of a light emitting diode according to some embodiments of the present disclosure.

Reference is made to FIG. 3. FIG. 3 is a schematic top view of a light emitting diode 100B according to some embodiments of the present disclosure, in which the first electrode 150 is omitted for simplicity. It should be pointed out that a difference between the light emitting diode 100B illustrated in FIG. 3 and the light emitting diode 100A illustrated in FIG. 2 is that, the high resistance portion 114 illustrated in FIG. 2 is surrounded by the second low resistance portion 116, while the high resistance portion 114 illustrated in FIG. 3 is surrounded by a plurality of the second low resistance portions 116A, 116B, 116C. The second low resistance portions 116A, 116B, 116C may have the same resistivity, or at least two of the second low resistance portions 116A, 116B, 116C have different resistivities. In the light emitting diode 100B illustrated in FIG. 3, details which are similar to the light emitting diode 100A illustrated in FIG. 2 are not repeated to avoid duplicity.

Figure 4:
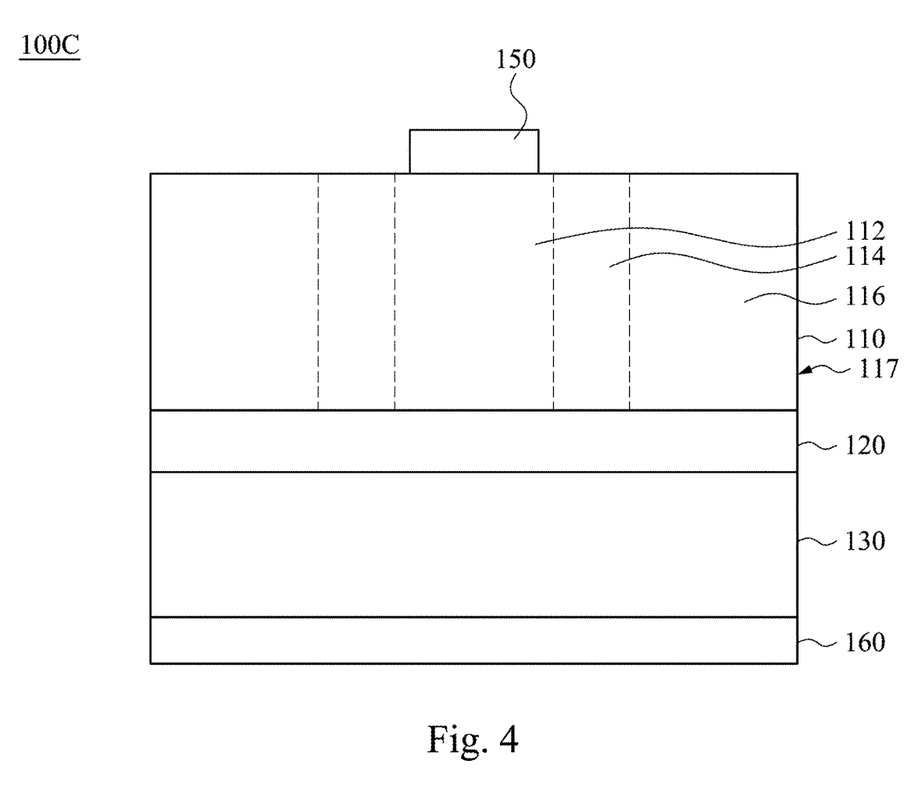
FIG. 4 is a schematic cross-sectional view of a light emitting diode according to some embodiments of the present disclosure.

Reference is made to FIG. 4. FIG. 4 is a schematic cross-sectional view of a light emitting diode 100C according to some embodiments of the present disclosure. It should be pointed out that a difference between the light emitting diode 100C illustrated in FIG. 4 and the light emitting diode 100A illustrated in FIG. 1 is that, the first electrode 150 is in contact with at least a portion of the first low resistance portion 112 and is free from contacting with the high resistance portion 114 and the second low resistance portion 116. In the light emitting diode 100C illustrated in FIG. 4, details which are similar to the light emitting diode 100A illustrated in FIG. 1 are not repeated to avoid duplicity.

Figure 5:
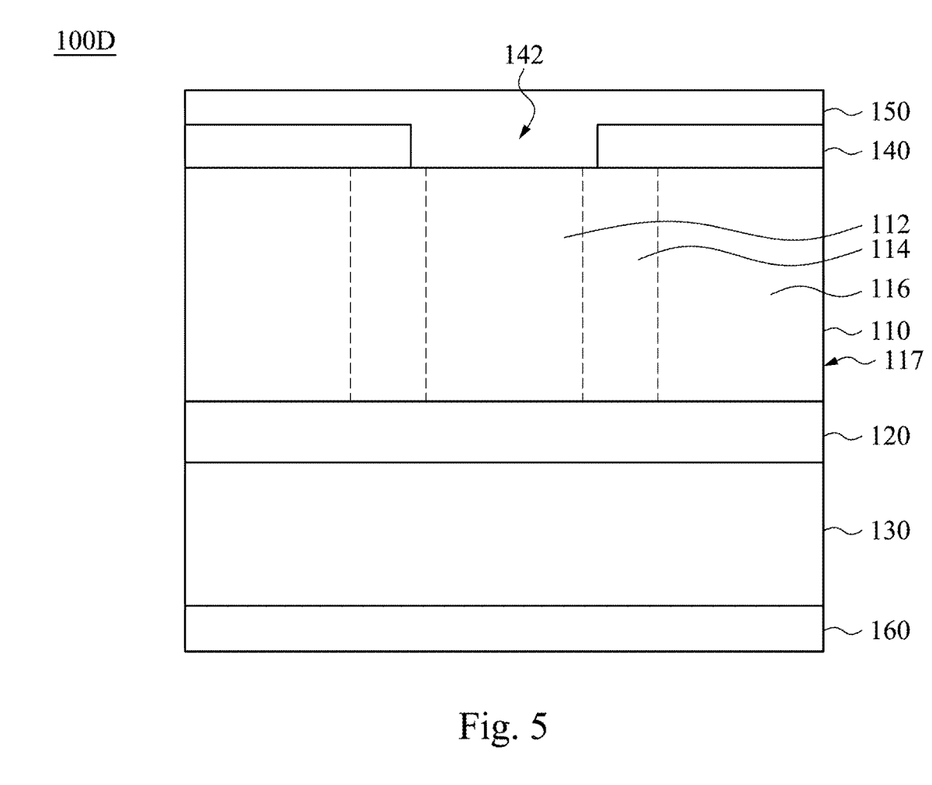
FIG. 5 is a schematic cross-sectional view of a light emitting diode according to some embodiments of the present disclosure.

Reference is made to FIG. 5. FIG. 5 is a schematic cross-sectional view of a light emitting diode 100D according to some embodiments of the present disclosure. It should be pointed out that a difference between the light emitting diode 100D illustrated in FIG. 5 and the light emitting diode 100A illustrated in FIG. 1 is that, apart from features which has been illustrated in the embodiments supported by FIG. 1, the light emitting diode 100D further includes a first current control layer 140. In some embodiments, at least a portion of the first current control layer 140 is between the first electrode 150 and the first type semiconductor layer 110, and the first current control layer 140 has a first opening 142 therein. A vertical projection of the first opening 142 on a top surface of the first type semiconductor layer 110 at least partially overlaps with the first low resistance portion 112, and the first electrode 150 is electrically connected to the first low resistance portion 112 through the first opening 142. In some embodiments, at least a portion of the first current control layer 140 is formed between the first electrode 150 and the second low resistance portion 116. As shown in FIG. 5, the first electrode 150 and the first current control layer 140 are further extended outwards over the second low resistance portion 116, and the first electrode 150 is separated from the second low resistance portion 116 by the first current control layer 140. In the light emitting diode 100D illustrated in FIG. 5, details which are similar to the light emitting diode 100A illustrated in FIG. 1 are not repeated to avoid duplicity.

Figure 6:
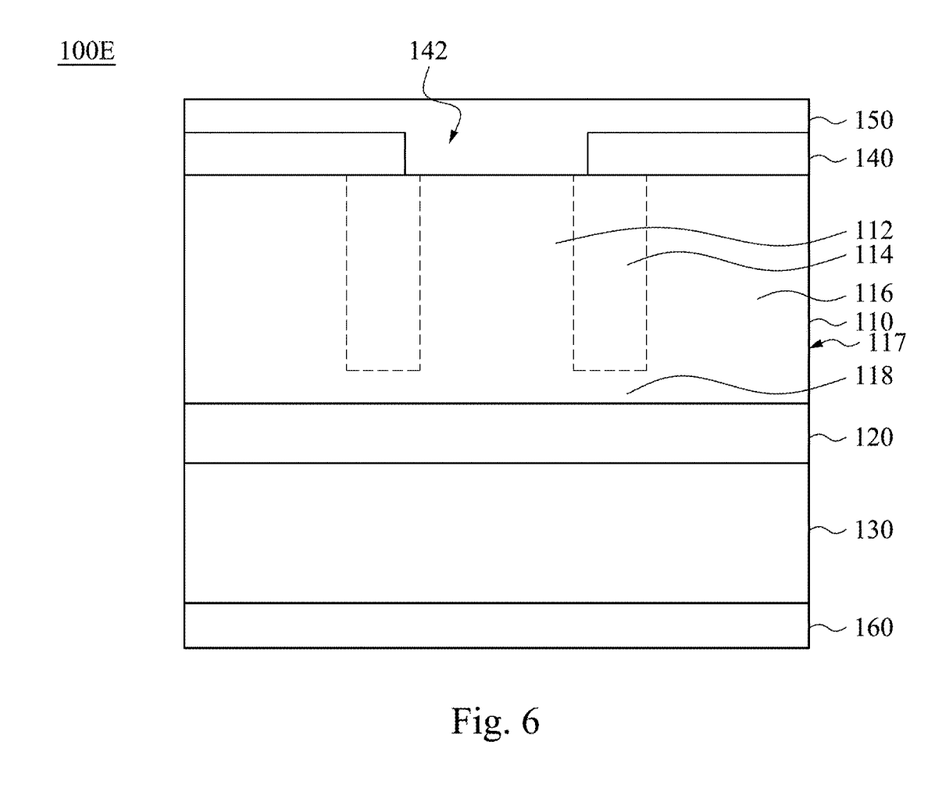
FIG. 6 is a schematic cross-sectional view of a light emitting diode according to some embodiments of the present disclosure.

Reference is made to FIG. 6. FIG. 6 is a schematic cross-sectional view of a light emitting diode 100E according to some embodiments of the present disclosure. It should be pointed out that a difference between the light emitting diode 100E illustrated in FIG. 6 and the light emitting diode 100D illustrated in FIG. 5 is that, apart from features which has been illustrated in the embodiments supported by FIG. 5, the first type semiconductor layer 110 of the light emitting diode 100E further includes a third low resistance portion 118 connecting the first low resistance portion 112 and the second low resistance portion 116, and the high resistance portion 114 is separated from the active layer 120 by the third low resistance portion 118. In these embodiments, the resistivity of the first type semiconductor layer 110 increases from the third low resistance portion 118 toward the high resistance portion 114. In the light emitting diode 100E illustrated in FIG. 6, details which are similar to the light emitting diode 100D illustrated in FIG. 5 are not repeated to avoid duplicity. In some embodiments, the first electrode 150 is in contact with at least a portion of the first low resistance portion 112 and is free from contacting with the second low resistance portion 116. In some embodiments, the light emitting diode 100E may have no current control layer 140.

Figure 7:
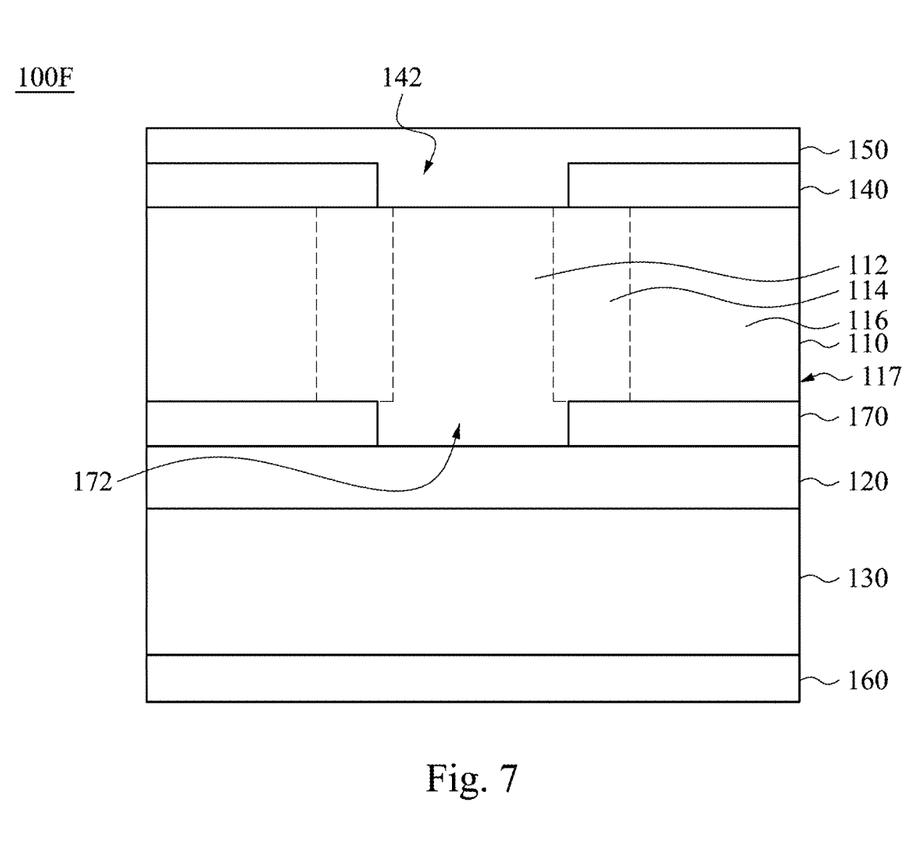
FIG. 7 is a schematic cross-sectional view of a light emitting diode according to some embodiments of the present disclosure.

Reference is made to FIG. 7. FIG. 7 is a schematic cross-sectional view of a light emitting diode 100F according to some embodiments of the present disclosure. It should be pointed out that a difference between the light emitting diode 100F illustrated in FIG. 7 and the light emitting diode 100D illustrated in FIG. 5 is that, apart from features which has been illustrated in the embodiments supported by FIG. 5, the light emitting diode 100F further includes a second current control layer 170. At least a portion of the second current control layer 170 is between the top surface of the first type semiconductor layer 110 and the second electrode 160. The second current control layer 170 has a second opening 172 therein, and a vertical projection of the second opening 172 projected on the top surface of the first type semiconductor layer 110 at least partially overlaps with the first low resistance portion 112.

In some embodiments as illustrated by FIG. 7, a portion of the second current control layer 170 is between the high resistance portion 114 and the active layer 120, and the current control layer 170 is in contact with the active layer 120.

In some embodiments as illustrated by FIG. 7, the second current control layer 170 is extended between the second low resistance portion 116 and the active layer 120, and thus the second low resistance portion 116 and the active layer 120 are separated by the second current control layer 170.

Figure 8:
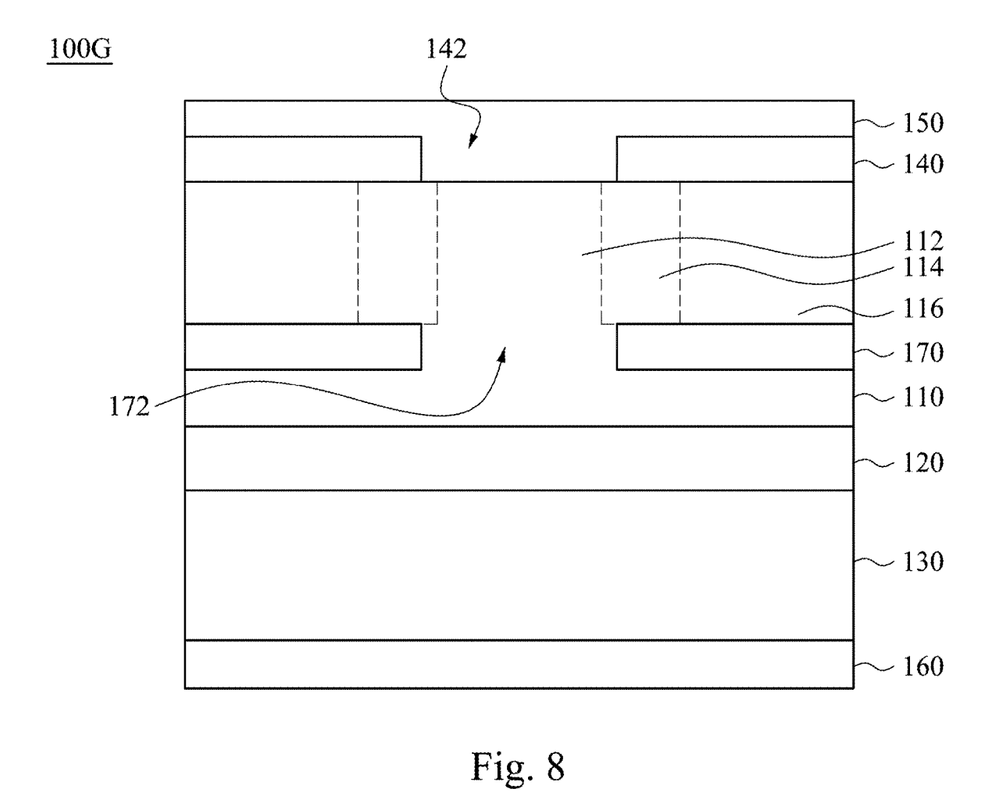
FIG. 8 is a schematic cross-sectional view of a light emitting diode according to some embodiments of the present disclosure.

Reference is made to FIG. 8. FIG. 8 is a schematic cross-sectional view of a light emitting diode 100G according to some embodiments of the present disclosure. It should be pointed out that a difference between the light emitting diode 100G illustrated in FIG. 8 and the light emitting diode 100F illustrated in FIG. 7 is that, the second current control layer 170 of the light emitting diode 100F is embedded in the first type semiconductor layer 110 and separated from the active layer 120 by a portion of the first type semiconductor layer 110. In the light emitting diode 100G illustrated in FIG. 8, details which are similar to the light emitting diode 100F illustrated in FIG. 7 are not repeated to avoid duplicity.

Figure 9A:
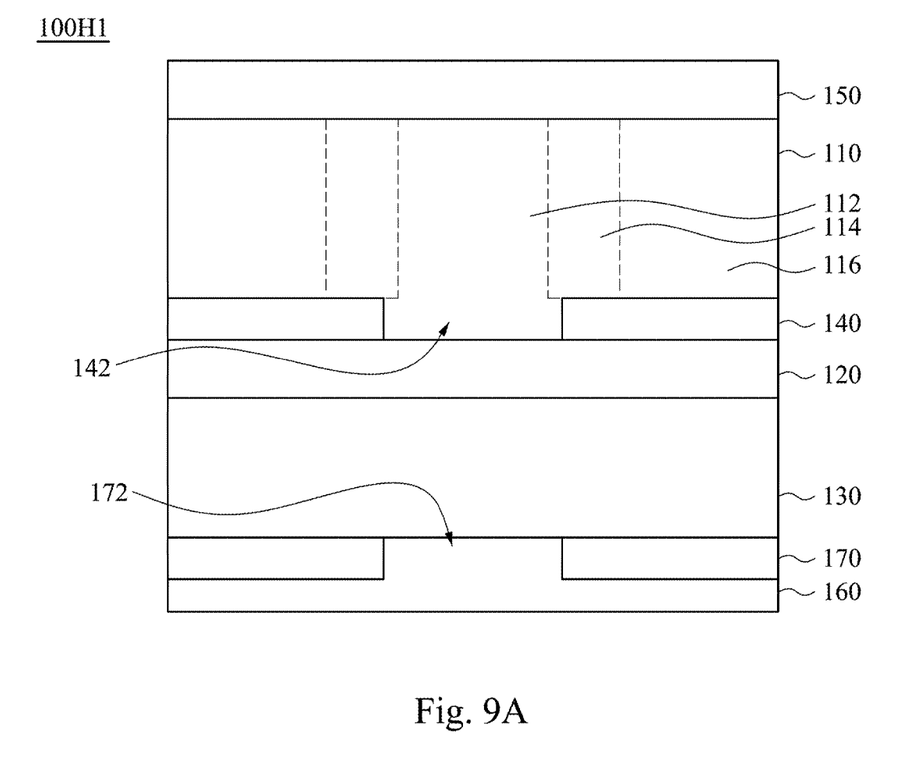
FIG. 9A is a schematic cross-sectional view of a light emitting diode according to some embodiments of the present disclosure.

Reference is made to FIG. 9A. FIG. 9A is a schematic cross-sectional view of a light emitting diode 100H1 according to some embodiments of the present disclosure. It should be pointed out that a difference between the light emitting diodes 100H1 illustrated in FIG. 9A and the light emitting diode 100A illustrated in FIG. 1 is that, apart from features which has been illustrated in the embodiments supported by FIG. 1, the light emitting diode 100H1 further includes a current control layer 140 in the first type semiconductor layer 110. The current control layer 140 has an opening 142 therein, and a vertical projection of the opening 142 projected on a top surface of the first type semiconductor layer 110 at least partially overlaps with the first low resistance portion 112. In some embodiments as illustrated by FIG. 9A, the current control layer 140 is in contact with the active layer 120.

In some embodiments as illustrated by FIG. 9A, the first electrode 150 is extended outwards over and in contact with the second low resistance portion 116. However, there is substantially no current flowing between the first electrode 150 and the second low resistance portion 116. Furthermore, the current control layer 140 is extended between the second low resistance portion 116 and the active layer 120, and thus the second low resistance portion 116 and the active layer 120 are separated by the current control layer 140.

In some embodiments as illustrated by FIG. 9A, the light emitting diode 100H1 further includes a current control layer 170, and at least a portion of the current control layer 170 is between the second electrode 160 and the second type semiconductor layer 130. The current control layer 170 has an opening 172 therein. A vertical projection of the opening 172 projected on a top surface of the first type semiconductor layer 110 at least partially overlaps with the first low resistance portion 112, and the second electrode 160 is electrically connected to the second type semiconductor layer 130 through the opening 172. In some embodiments, the current control layer 170 is between the second type semiconductor layer 130 and the active layer 120, and the current control layer 170 is in contact with the active layer 120. In some embodiments, the current control layer 170 is embedded in the second type semiconductor layer 130 and separated from the active layer 120 by a portion of the second type semiconductor layer 130.

Figure 9B:
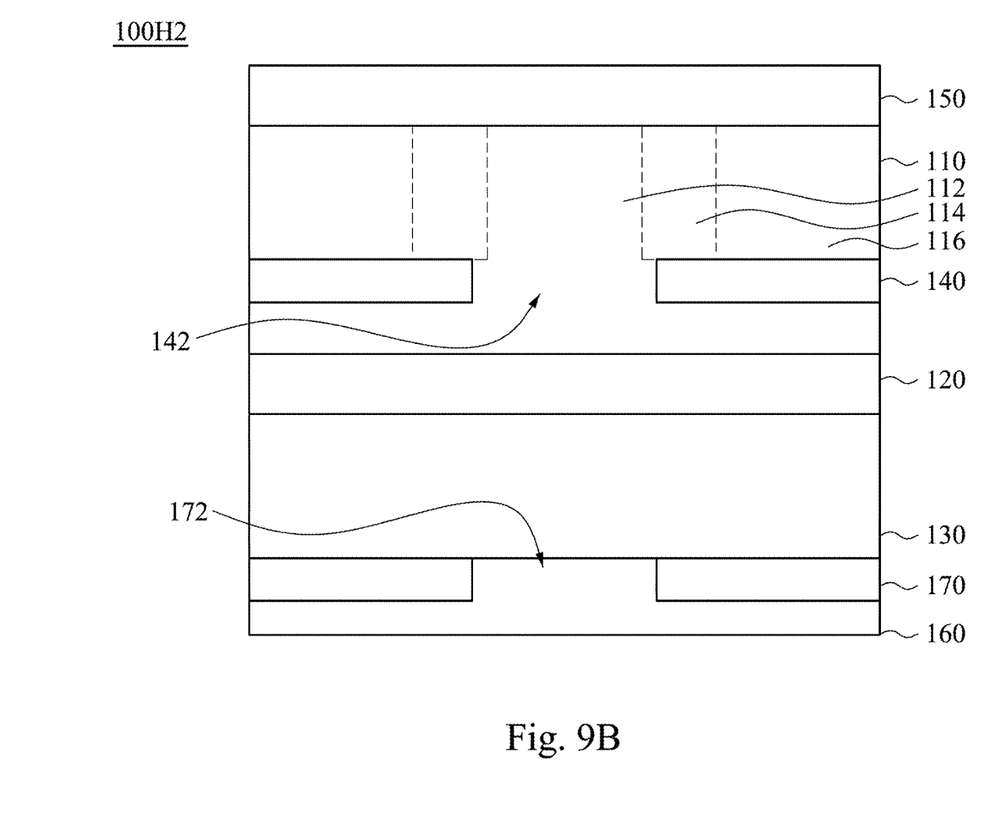
FIG. 9B is a schematic cross-sectional view of a light emitting diode according to some embodiments of the present disclosure.

Reference is made to FIG. 9B. FIG. 9B is a schematic cross-sectional view of a light emitting diode 100H2 according to some embodiments of the present disclosure. It should be pointed out that a difference between the light emitting diodes 100H2 illustrated in FIG. 9B and the light emitting diode 100H1 illustrated in FIG. 9A is that, apart from features which has been illustrated in the embodiments supported by FIG. 9A, the current control layer 140 is separated from the active layer 120 by a portion of the first type semiconductor layer 110. That is, the current control layer 140 is embedded in the first type semiconductor layer 110 without contacting with the active layer 120. In some embodiments, at least a portion of the current control layer 170 is between the second electrode 160 and the second type semiconductor layer 130. In some embodiments, the current control layer 170 is between the second type semiconductor layer 130 and the active layer 120, and the current control layer 170 is in contact with the active layer 120. In some embodiments, the current control layer 170 is embedded in the second type semiconductor layer 130 and separated from the active layer 120 by a portion of the second type semiconductor layer 130. In the light emitting diode 100H2 illustrated in FIG. 9B, details which are similar to the light emitting diode 100H1 illustrated in FIG. 9A are not repeated to avoid duplicity.

Figure 10:
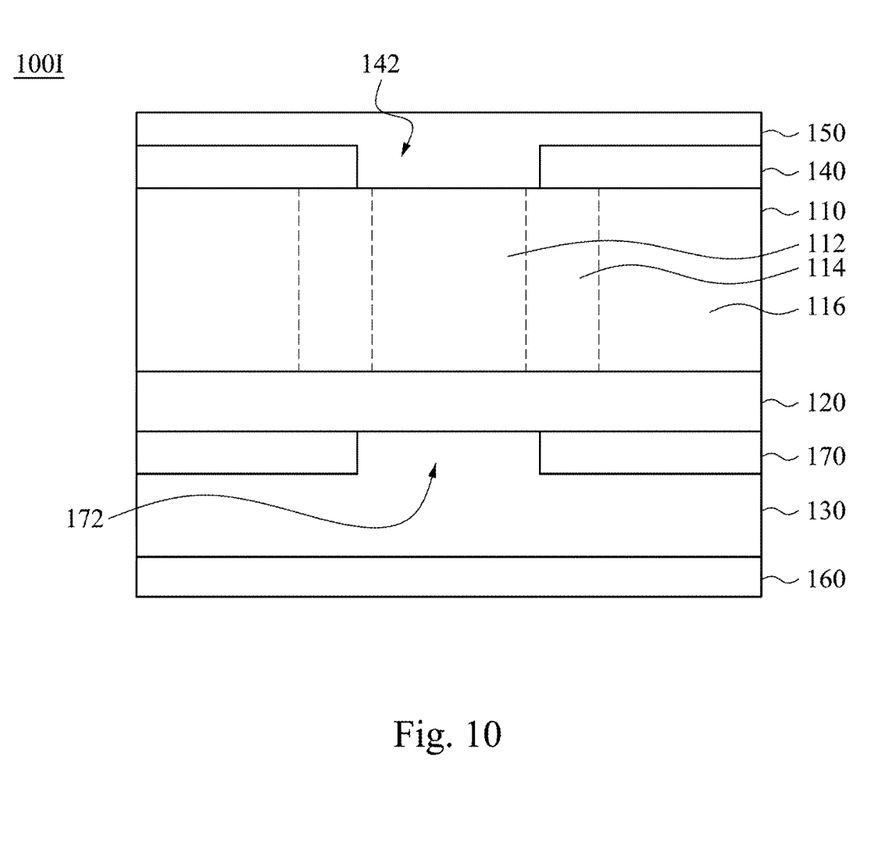
FIG. 10 is a schematic cross-sectional view of a light emitting diode according to some embodiments of the present disclosure.

Reference is made to FIG. 10. FIG. 10 is a schematic cross-sectional view of a light emitting diode 100I according to some embodiments of the present disclosure. It should be pointed out that a difference between the light emitting diode 100I illustrated in FIG. 10 and the light emitting diode 100D illustrated in FIG. 5 is that, apart from features which has been illustrated in the embodiments supported by FIG. 5, the light emitting diode 100I further includes a current control layer 170 in the second type semiconductor layer 130, and the current control layer 170 has an opening 172 therein. In addition, a vertical projection of the opening 172 projected on a top surface of the first type semiconductor layer 110 at least partially overlaps with the first low resistance portion 112. In some embodiments as illustrated by FIG. 10, the current control layer 170 is in contact with the active layer 120.

Figure 11:
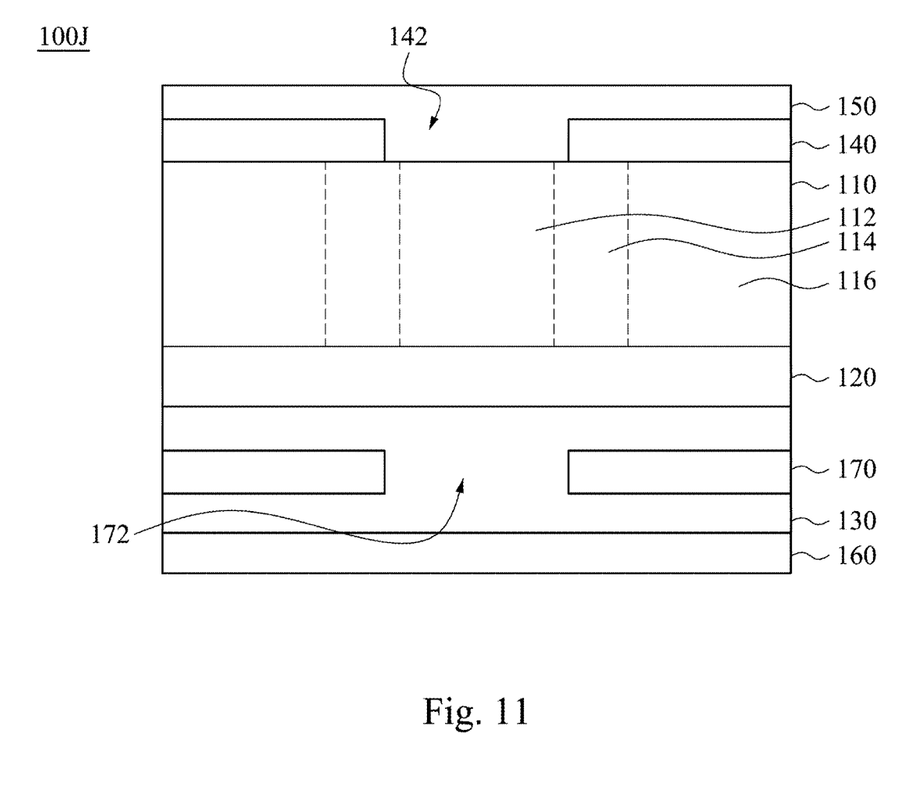
FIG. 11 is a schematic cross-sectional view of a light emitting diode according to some embodiments of the present disclosure.

Reference is made to FIG. 11. FIG. 11 is a schematic cross-sectional view of a light emitting diode 100J according to some embodiments of the present disclosure. It should be pointed out that a difference between the light emitting diode 100J illustrated in FIG. 11 and the light emitting diode 100I illustrated in FIG. 10 is that, apart from features which has been illustrated in the embodiments supported by FIG. 10, the current control layer 170 is separated from the active layer 120 by a portion of the second type semiconductor layer 130. That is, the current control layer 170 is embedded in the second type semiconductor layer 130 without contacting with the active layer 120. In some embodiments, the current control layer 170 is between the second electrode 160 and the second type semiconductor layer 130. In the light emitting diode 100J illustrated in FIG. 11, details which are similar to the light emitting diode 100I illustrated in FIG. 10 are not repeated to avoid duplicity.

Figure 12:
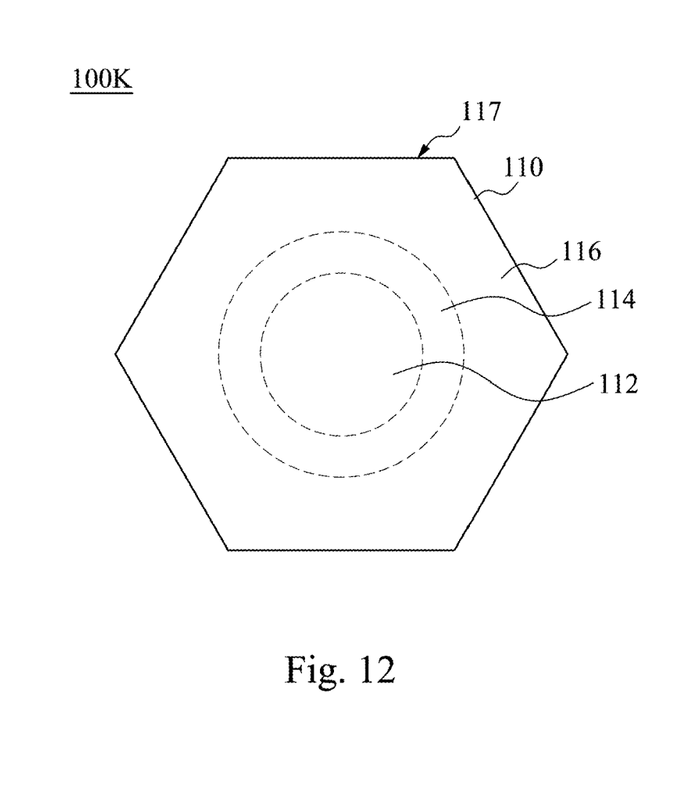
FIG. 12 is a schematic top view of a light emitting diode according to some embodiments of the present disclosure.
Figure 13:
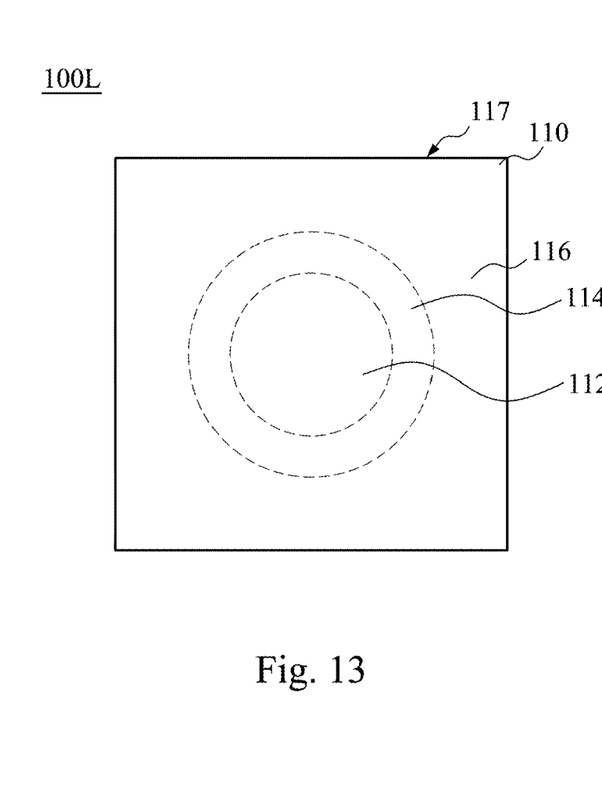
FIG. 13 is a schematic top view of a light emitting diode according to some embodiments of the present disclosure.

Reference is made to FIGS. 12 and 13. FIGS. 12 and 13 are schematic top views of light emitting diodes 100K, 100L according to some embodiments of the present disclosure, in which the first electrode 150 is omitted for simplicity. In some embodiments as illustrated in FIGS. 2 and 3, the contours of a side wall 117 of the light emitting diodes 100A, 100B are circular, but the disclosure is not limited to these embodiments. In some other embodiments, the contour of the side wall 117 may be hexagonal (as illustrated by FIG. 12), octagon or quadrilateral (as illustrated by FIG. 13), and the shapes should not be restricted herein.

Figure 14:
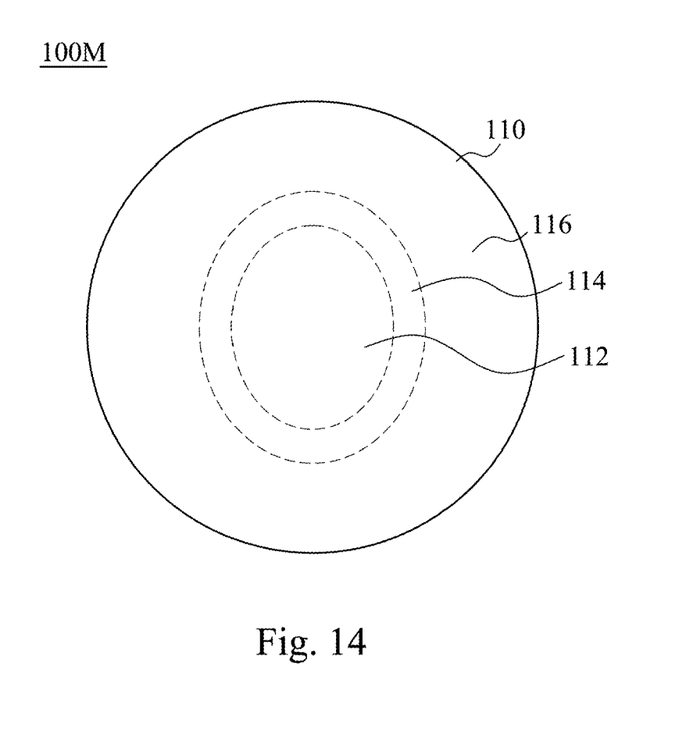
FIG. 14 is a schematic top view of a light emitting diode according to some embodiments of the present disclosure.
Figure 15:
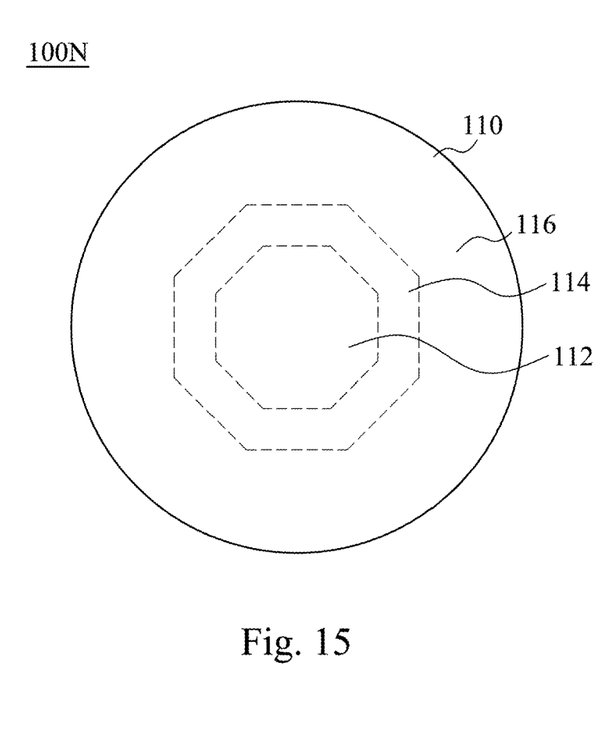
FIG. 15 is a schematic top view of a light emitting diode according to some embodiments of the present disclosure.

Reference is made to FIGS. 14 and 15. FIGS. 14 and 15 are schematic top views of light emitting diodes 100M, 100N according to some embodiments of the present disclosure, in which the first electrode 150 is omitted for simplicity. In some embodiments as illustrated in FIGS. 2 and 3, the contours of the first low resistance portion 112 and the high resistance portion 114 are circular, but the disclosure is not limited to these embodiments. In some other embodiments, the contours of the first low resistance portion 112 and the high resistance portion 114 may be oval (as illustrated by FIG. 14), octagonal (as illustrated by FIG. 15), or the like, and the shapes should not be restricted herein. The contours of the first low resistance portion 112 and the high resistance portion 114 may also be different in shapes.

In summary, the high resistance portion is configured to confine charge carriers substantially within the first low resistance portion. Specifically, since the resistivity of the first type semiconductor layer laterally increases from the first low resistance portion toward the high resistance portion, when the light emitting diode is biased, charge carriers are apt to flow through the first type semiconductor layer via the first low resistance portion, therefore improving the luminous efficiency of the light emitting diode.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light-emitting diode (LED), comprising:
    a first type semiconductor layer comprising a first low resistance portion, at least one second low resistance portion, and a high resistance portion, wherein the high resistance portion is between the first low resistance portion and the second low resistance portion, and a resistivity of the first type semiconductor layer increases from the first low resistance portion toward the high resistance portion and decreases from the high resistance portion toward the second low resistance portion, wherein the first low resistance portion has a top surface, a bottom surface, and an outer periphery between the top surface and the bottom surface, and the outer periphery of the first low resistance portion is enclosed by the high resistance portion;
    a first electrode electrically connected to the first low resistance portion and substantially no current flowing between the first electrode and the second low resistance portion, wherein the high resistance portion is configured to confine charge carriers substantially within the first low resistance portion;
    a second type semiconductor layer, wherein at least a portion of the first type semiconductor layer is between the first electrode and the second type semiconductor layer; and
    a second electrode electrically connected to the second type semiconductor layer.

2. The LED of claim 1, wherein the high resistance portion is surrounded by the second low resistance portion.

3. The LED of claim 1, wherein a plurality of the second low resistance portions has the same resistivity.

4. The LED of claim 1, wherein the at least one second low resistance portion is plural, and at least two of the second low resistance portions have different resistivities.

5. The LED of claim 1, wherein the high resistance portion defines a shape of the first low resistance portion.

6. The LED of claim 1, wherein the first electrode is in contact with at least a portion of the first low resistance portion and at least a portion of the high resistance portion and is free from contact with the second low resistance portion.

7. The LED of claim 1, wherein the first electrode is in contact with at least a portion of the first low resistance portion and is free from contact with the high resistance portion and the second low resistance portion.

8. The LED of claim 1, further comprising:
    a first current control layer, wherein at least a portion of the first current control layer is between the first electrode and the first type semiconductor layer, the first current control layer has a first opening therein, a vertical projection of the first opening on a top surface of the first type semiconductor layer at least partially overlaps with the first low resistance portion, and the first electrode is electrically connected to the first low resistance portion through the first opening.

9. The LED of claim 8, further comprising:
    a second current control layer, wherein at least a portion of the second current control layer is between the top surface of the first type semiconductor layer and the second electrode, the second current control layer has a second opening therein, and a vertical projection of the second opening on the top surface of the first type semiconductor layer at least partially overlaps with the first low resistance portion.

10. The LED of claim 1, further comprising:
    a current control layer, wherein at least a portion of the current control layer is between the first electrode and the second low resistance portion, the current control layer has an opening therein, a vertical projection of the opening on a top surface of the first type semiconductor layer at least partially overlaps with the first low resistance portion, and the first electrode is electrically connected to the first low resistance portion through the opening.

11. The LED of claim 1, further comprising:
a current control layer in the first type semiconductor layer, wherein the current control layer has an opening therein, and a vertical projection of the opening on a top surface of the first type semiconductor layer at least partially overlaps with the first low resistance portion.

12. The LED of claim 11, further comprising:
an active layer between the first type semiconductor layer and the second type semiconductor layer, wherein the current control layer is in contact with the active layer.

13. The LED of claim 11, further comprising:
an active layer between the first type semiconductor layer and the second type semiconductor layer, wherein the current control layer is separated from the active layer by a portion of the first type semiconductor layer.

14. The LED of claim 1, further comprising:
a current control layer, wherein at least a portion of the current control layer is between the second electrode and the second type semiconductor layer, the current control layer has an opening therein, a vertical projection of the opening on a top surface of the first type semiconductor layer at least partially overlaps with the first low resistance portion, and the second electrode is electrically connected to the second type semiconductor layer through the opening.

15. The LED of claim 1, further comprising:
a current control layer in the second type semiconductor layer, wherein the current control layer has an opening therein, and a vertical projection of the opening on a top surface of the first type semiconductor layer at least partially overlaps with the first low resistance portion.

16. The LED of claim 15, further comprising:
an active layer between the first type semiconductor layer and the second type semiconductor layer, wherein the current control layer is in contact with the active layer.

17. The LED of claim 15, further comprising:
an active layer between the first type semiconductor layer and the second type semiconductor layer, wherein the current control layer is separated from the active layer by a portion of the second type semiconductor layer.

* * * * *